United States Patent
Johnson et al.

(10) Patent No.: US 10,201,115 B2
(45) Date of Patent: Feb. 5, 2019

(54) SERVER CHASSIS WITH A LIQUID COOLING ENABLEMENT MODULE IN AN INPUT/OUTPUT MODULE BAY

(71) Applicant: DELL PRODUCTS, LP, Round Rock, TX (US)

(72) Inventors: Robert W. Johnson, Round Rock, TX (US); Robert Boyd Curtis, Georgetown, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/470,316

(22) Filed: Mar. 27, 2017

(65) Prior Publication Data

US 2018/0279510 A1 Sep. 27, 2018

(51) Int. Cl.
  H05K 7/20 (2006.01)

(52) U.S. Cl.
  CPC ..... *H05K 7/20781* (2013.01); *H05K 7/20736* (2013.01); *H05K 7/20572* (2013.01); *H05K 7/20636* (2013.01); *H05K 7/20645* (2013.01); *H05K 7/20772* (2013.01)

(58) Field of Classification Search
  CPC ............. H05K 7/20627–7/20636; H05K 7/20763–7/20772; H05K 7/20218; H05K 7/20254
  USPC ................. 361/679.46–679.54, 688–723
  See application file for complete search history.

(56) References Cited

U.S. PATENT DOCUMENTS

| | | | |
|---|---|---|---|
| 7,318,322 B2* | 1/2008 | Ota | H05K 7/20781 62/259.2 |
| 7,907,398 B2 | 3/2011 | Hrehor, Jr. et al. | |
| 8,305,754 B2* | 11/2012 | Wu | H05K 7/20781 165/104.21 |
| 8,405,975 B2 | 3/2013 | Heiberg et al. | |
| 8,670,241 B2* | 3/2014 | Sherrod | H05K 7/1492 361/725 |
| 9,215,832 B2* | 12/2015 | Chang | H05K 7/20781 |
| 9,462,728 B2* | 10/2016 | Demange | H05K 7/20772 |
| 9,575,521 B1 | 2/2017 | North et al. | |
| 2004/0008483 A1* | 1/2004 | Cheon | G06F 1/20 361/679.53 |
| 2004/0057211 A1* | 3/2004 | Kondo | G06F 1/20 361/696 |
| 2010/0085712 A1 | 4/2010 | Hrehor, Jr. et al. | |
| 2017/0127575 A1* | 5/2017 | Lunsman | F16L 37/12 |

* cited by examiner

*Primary Examiner* — Zachary Pape
(74) *Attorney, Agent, or Firm* — Larson Newman, LLP (57) ABSTRACT

A chassis includes a compute device and a liquid cooling enablement module. The compute device includes a processor, a cold plate, and first cold and hot liquid lines. The first cold liquid line directs cool liquid from a first cold liquid interconnect of the compute device to the cold plate. The first hot liquid line directs heated liquid from the cold plate to a first hot liquid interconnect of the compute device. The liquid cooling enablement module is a modular self-contained component, and includes a second cold liquid interconnect, and a second hot liquid interconnect. The second cold liquid interconnect directs the liquid from the liquid cooling enablement module to the first cold liquid line via the first cold liquid interconnect. The second hot liquid interconnect directs the liquid from the first hot liquid line to the liquid cooling enablement module via the first hot liquid interconnect.

18 Claims, 5 Drawing Sheets

SERVER CHASSIS WITH A LIQUID COOLING ENABLEMENT MODULE IN AN INPUT/OUTPUT MODULE BAY

FIELD OF THE DISCLOSURE

The present disclosure generally relates to information handling systems, and more particularly relates to a server chassis with a liquid cooling enablement module in an input/output module bay.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A chassis includes a compute device and a liquid cooling enablement module. The compute device includes a processor, a cold plate in physical communication with the processor, a first cold liquid line, and a first hot liquid line. The first cold liquid line may direct cool liquid from a first cold liquid interconnect of the compute device to the cold plate. The first hot liquid line may direct heated liquid from the cold plate to a first hot liquid interconnect of the compute device. The liquid cooling enablement module is a self-contained modular component that can be added to the chassis at any time. The liquid cooling enablement module includes a second cold liquid interconnect, and a second hot liquid interconnect. The second cold liquid interconnect may direct the liquid from the liquid cooling enablement module to the first cold liquid line via the first cold liquid interconnect. The second hot liquid interconnect may direct the liquid from the first hot liquid line to the liquid cooling enablement module via the first hot liquid interconnect.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
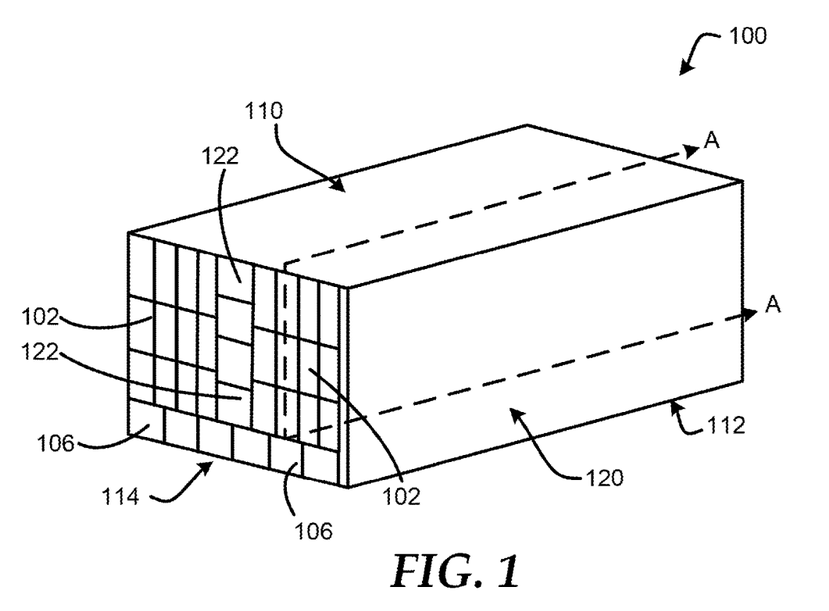
FIG. 1 is a perspective view of a front of a server chassis according to at least one embodiment of the present disclosure.
Figure 2:
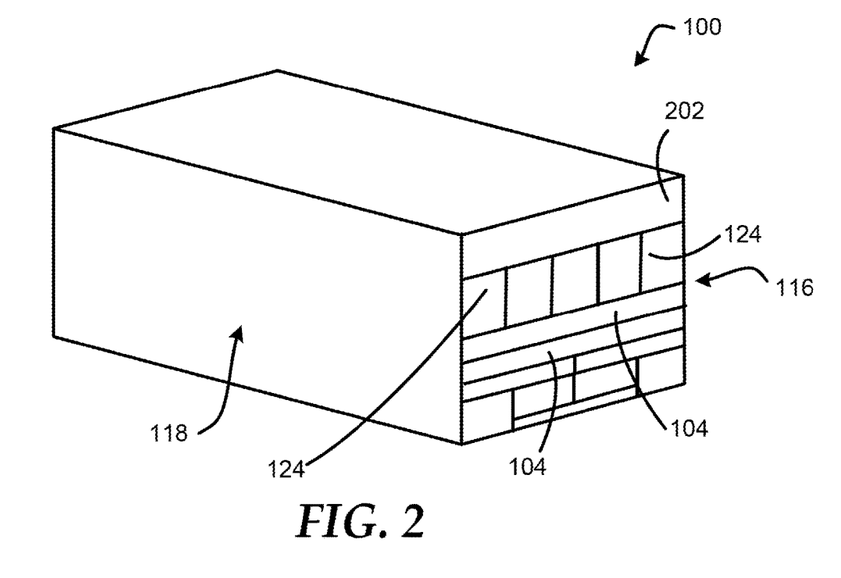
FIG. 2 is a perspective view of the rear of a server chassis according to at least one embodiment of the present disclosure.

FIGS. 1 and 2 show a chassis 100 to hold multiple information handling systems, such as compute devices 102, input/output (I/O) devices 104, and power supply units 106. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The chassis includes a top panel 110, a bottom panel 112, a front panel 114, a back panel 116, and side panels 118 and 120. The components and devices located within the front panel 114 the chassis 100 include multiple compute devices 102, power supply units 106, and fans 122. In an embodiment, the compute devices 102 can be peripheral devices, such as storage devices, peripheral component interconnect express (PCIe) devices, or the like. In an embodiment, the compute devices 102 can utilize most of the space of the front panel 114 except where the power supply units 106 extend horizontally across the bottom of the front panel 114 adjacent to the bottom panel 112, and the fans 122 extend vertically down the center of the front panel from the top panel 110 to the top of the power supply units 106. In an embodiment, each the power supply units 106 includes fan within the power supply unit itself.

The components and devices located within the back panel 116 the chassis 100 include multiple I/O devices 104, a first group of fans 124, and a liquid cooling enablement module 202. In an embodiment, the liquid cooling enablement module 202 can be oriented horizontally across the top of the back panel 116. The fans 124 can be located in a horizontal row below the liquid cooling enablement module 202 within the back panel 116, and the I/O devices 104 can be located in a horizontal row below the fans 124 within the back panel 116. In an embodiment, the liquid cooling enablement module 202 can take the same amount of space within the back panel 116 as two of the I/O devices 104.

Figure 3:
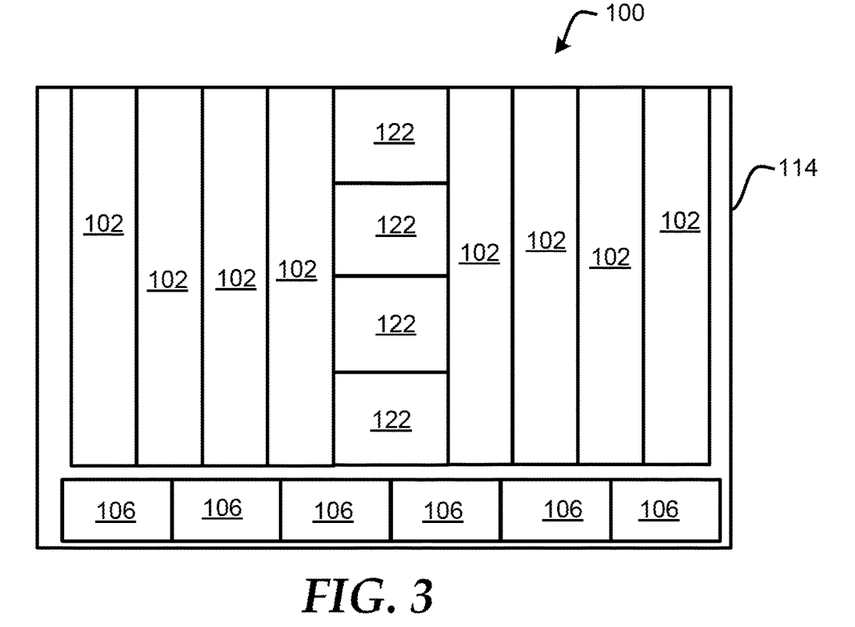
FIG. 3 is a block diagram of a front panel of the server chassis with multiple components and fans according to at least one embodiment of the present disclosure.
Figure 4:
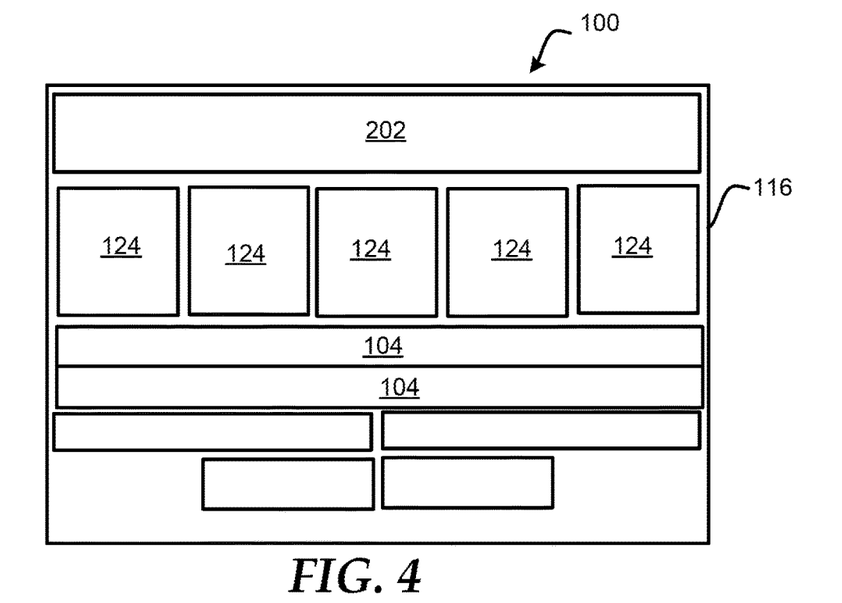
FIG. 4 is a block diagram of a rear panel of the server chassis with multiple components and fans according to at least one embodiment of the present disclosure.

FIG. 3 shows the front panel 114 of the chassis 100 including the compute devices 102, the power supply units 106, and the fans 122 according to at least one embodiment of the present disclose. FIG. 4 shows the rear panel 116 of the chassis 100 including the I/O devices 104, the fans 124, and the liquid cooling enablement module 202 according to at least one embodiment of the present disclose. In an embodiment, the fans 122 can push air from the front panel 114 through the chassis 100 to cool the I/O devices 104. The fans 124 pull air from the front panel 114 across the compute devices 102 and out the back panel 116 to provide cooling to the compute devices 102. The components of the liquid cooling enablement module 202 can provide cooling to the components, such as processor cores, within the compute devices 102. In an embodiment, the fans within the power supply units 106 can pull air from the front panel 114 and provide the air across the power supply units 106, and then push the air out of the back panel 116 to provide cooling of only the power supply units 106.

Figure 5:
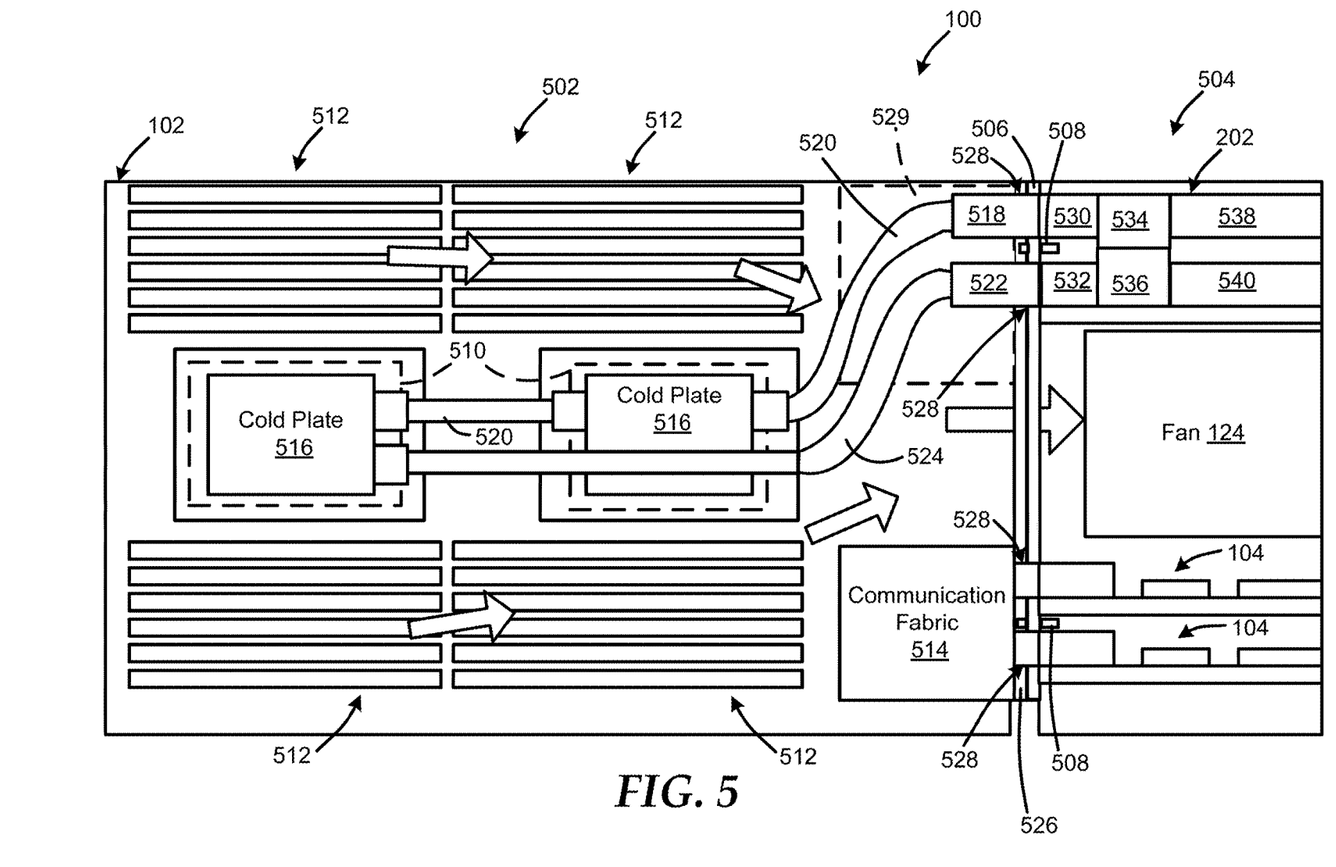
FIG. 5 is a block diagram of a cross section of the server chassis illustrating a front portion and a rear portion of the server chassis according to at least one embodiment of the present disclosure.

FIG. 5 illustrates a cross section of the server chassis 100, taken along the line A-A in FIG. 1, including a front portion 502, a rear portion 504, a bulkhead 506, and alignment pins 508 according to at least one embodiment of the present disclosure. In an embodiment, the bulkhead 506 is located in between the front portion 502 and the rear portion 504, and the bulkhead 506 can direct airflow from front portion 502 to the rear portion 504. The front portion 502 includes the compute device 102, and the rear portion includes I/O devices 104, a fan 124, and the liquid cooling enablement module 202. The alignment pins 508 can align the compute device 102 within the front portion 502, and can align the I/O devices 104, and the liquid cooling enablement module 202 within the rear portion 504.

The compute device 102 includes processor cores 510 indicated by the dashed lines, memory devices 512, a communication fabric 514, cold plates 516, a cold liquid interconnect 518, a cold liquid line 520, a hot liquid interconnect 522, and a hot liquid line 524 (cooling components 516, 518, 520, 522, and 524). The processors 510 are in communication with the memory devices 512 and with the communication fabric 514. The liquid cooling enablement module 202 includes a cold liquid interconnect 530, a hot liquid interconnect 532, a cold liquid manifold 534, a hot liquid manifold 536, a cold liquid line 538, and a hot liquid line 540. The compute device 102 also includes a back panel 526 which includes a plurality of openings 528 to enable communication between the communication fabric 514 and the I/O devices 104. In an embodiment, the bulkhead 506 includes openings aligned with the openings 528 within the back panel 526.

The communication fabric 514 can connect with and communicate with the I/O modules 104 through the openings 528 at a bottom of the compute device 102. The processors 510 can utilize the communication fabric 514 and the I/O modules 104 to communicate with external devices. The I/O modules 104 can be located within I/O module bays of the rear portion 504. In the embodiment of the compute device 102, shown in FIG. 5, the cold liquid interconnect 518, the cold liquid line 520, the hot liquid interconnect 522, and the hot liquid line 524 extend over a location 529, identified by dashed line, where a communication fabric might be located in a top portion of the compute device 102. In another embodiment, the cold liquid interconnect 518, the cold liquid line 520, the hot liquid interconnect 522, and the hot liquid line 524 can be located where in the communication fabric 514 is located in FIG. 5, and the communication fabric 514 can be located at the location 529 without varying from the scope of this disclosure. In this embodiment, the I/O devices 104 and the liquid cooling enablement module 202 can swap locations within the rear portion 504, such that the I/O devices 104 can connect with the communication fabric 514, and the liquid cooling enablement module 202 can connect with the cold liquid interconnect 518 and the hot liquid interconnect 522.

During operation of the compute device 102, the fans 124 can draw air, as shown by the arrows in FIG. 5, from a front panel of the front portion 502, across the memory devices 512 and the processors 510, through an opening in the bulkhead 506, and then push the air out of the back of the rear portion 504. This air flow through the chassis 100 can cool the memory devices 512 and the processor 510. In an embodiment, the processor or other components within the compute device, such as the memory devices 512, communication fabric adaptors, or the like, may need additional cooling, and in this situation the compute device 102 can be altered from having two communication fabrics to only having one communication fabric 514 and the cooling components 516, 518, 520, 522, and 524 can be added to the compute device 102 to provide additional cooling to the processors 510. In this situation, I/O modules 104 located in an I/O module bay above the fan 124 can be replaced by the liquid cooling enablement module 202, such that the liquid cooling enablement module 202 is inserted within the I/O module bay above the fan 124.

When the liquid cooling enablement module 202 is inserted within the I/O module bay in the rear portion 504, the cold liquid interconnect 518 of the compute device 102 can be coupled to the cold liquid interconnect 530 of the liquid cooling enablement module 202 via a first opening 528 in the back panel 526 and the corresponding opening in the bulkhead 506. Similarly, the hot liquid interconnect 522 of the compute device 102 can be coupled to the hot liquid interconnect 532 of the liquid cooling enablement module 202 via a second opening 528 in the back panel 526 and the corresponding opening in the bulkhead 506. The liquid cooling enablement module 202 provides cool liquid to the cool liquid line 520 via interconnects 518 and 530. The cooling liquid is then provided to the first cold plate 516, which utilizes the cooling liquid to remove heat from the processor 510 in thermal communication with the first cold plate 516. The cooling liquid is then provided, via the cold liquid line 520, to the second cold plate 516, which utilizes the cooling liquid to remove heat from the processor 510 in thermal communication with the second cold plate. The heated cooling liquid is then provided to the liquid cooling enablement module 202 via the hot liquid line 524 and the hot liquid interconnects 522 and 532.

Figure 6:
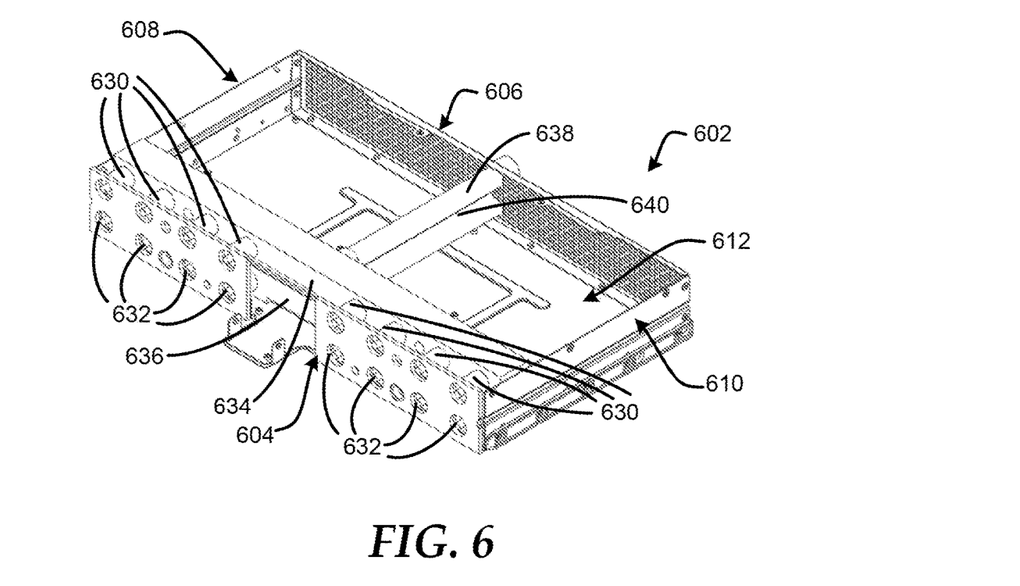
FIG. 6 is a front perspective view of a first embodiment of a liquid cooling enablement module according to at least one embodiment of the present disclosure.
Figure 7:
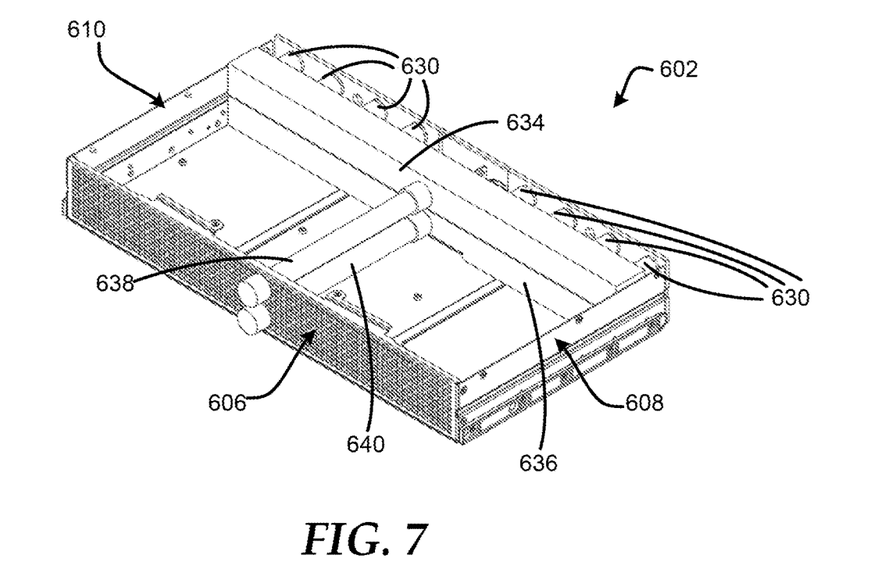
FIG. 7 is a rear perspective view of the first embodiment of the liquid cooling enablement module according to at least one embodiment of the present disclosure.

FIG. 6 illustrates a front perspective view of a liquid cooling enablement module 602 that is a particular embodiment of the liquid cooling enablement module 202 of FIGS. 2, 4, and 5. FIG. 7 illustrates a rear perspective view of the liquid cooling enablement module 602 according to at least one embodiment of the present disclosure. The liquid cooling enablement module 602 includes a front panel 604, a back panel 606, side panels 608 and 610, a bottom panel 612, and a top panel that has been hidden to reveal the components within the liquid cooling enablement module 602. The liquid cooling enablement module 602 also includes a cold liquid interconnect 630, a hot liquid interconnect 632, a cold liquid manifold 634, a hot liquid manifold 636, a cold liquid line 638, and a hot liquid line 640, which correspond to the cold liquid interconnect 530, a hot liquid interconnect 532, a cold liquid manifold 534, a hot liquid manifold 536, a cold liquid line 538, and a hot liquid line 540 of FIG. 5.

When the liquid cooling enablement module 602 is inserted into the rear portion 504 of the chassis 100, each of the cold liquid interconnects 630 connects with a cold liquid interconnect 518 of a different compute device 102 to provide cold liquid to the cooling components 516, 518, 520, 522, and 524 of the compute devices 102, and each of the hot liquid interconnects 632 connects with a hot liquid interconnect 522 of a different compute device 102 to receive heated liquid from the cooling components 516, 518, 520, 522, and 524 of the compute devices 102 as described above with respect to FIG. 5. The cold liquid line 638 and the hot liquid line 840 can extend beyond the back panel 606 and can connect with water facilities outside the chassis 100. In an embodiment, the water facilities can include a pump to provide cold liquid to the cold liquid line 638, which in turn provides the cold liquid to the cold liquid manifold 634. The cold liquid manifold 634 can then distribute the cold liquid to each of the cold liquid interconnects 630, which in turn provide the cold liquid to a respective cold liquid interconnect 518 of a compute device 102 to provide liquid cooling to the processors 510 of the computer device 102.

The liquid is then heated via the heat exchange from the processors 510 to the cold plates 516. The heated liquid is then provided to the hot liquid interconnect 632 of the liquid cooling enablement module via the hot liquid interconnect 522 of the compute device 102. The heated liquid from each of the hot liquid interconnects 632 can then be conveyed through the hot liquid manifold 636 to the water facilities via the hot liquid line 640. The water facilities can then cool the heated water via a suitable method. The cycle can then be repeated by the cooled liquid being provided to the liquid cooling enablement module 202 as described above.

Figure 8:
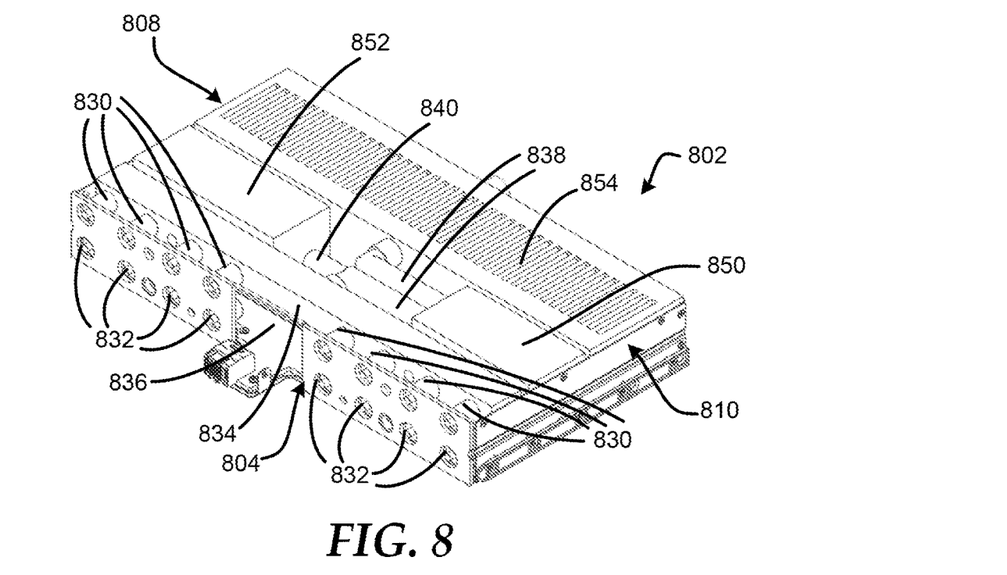
FIG. 8 is a front perspective view of a second embodiment of the liquid cooling enablement module according to at least one embodiment of the present disclosure.
Figure 9:
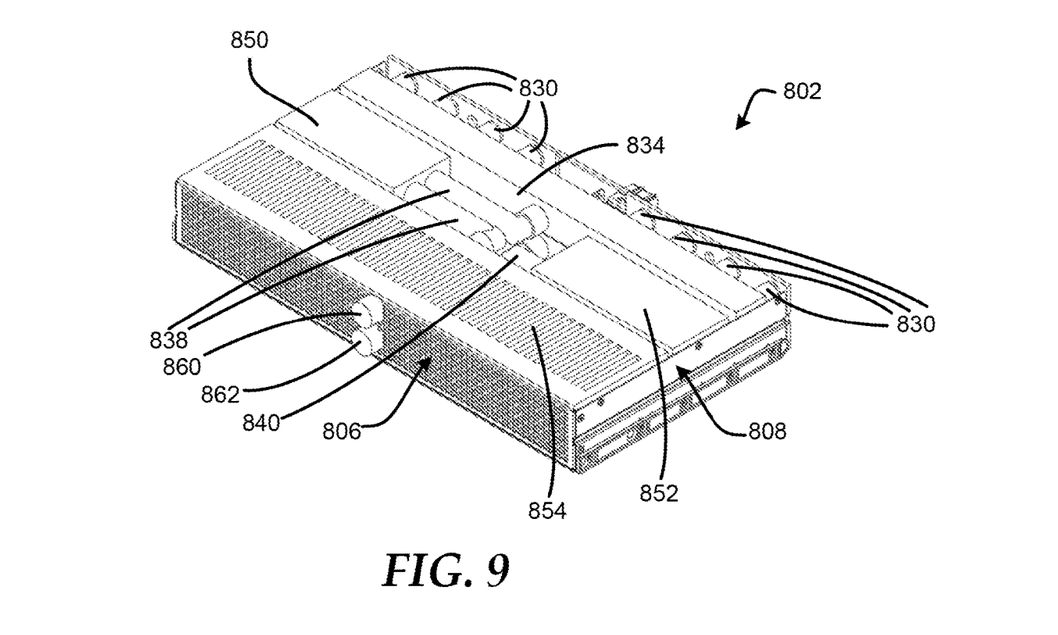
FIG. 9 is a rear perspective view of the second embodiment of the liquid cooling enablement module according to at least one embodiment of the present disclosure.

FIG. 8 illustrates a front perspective view of a liquid cooling enablement module 802 that is a second embodiment of the liquid cooling enablement module 202 of FIGS. 2, 4, and 5. FIG. 9 illustrates a rear perspective view of the liquid cooling enablement module 802 according to at least one embodiment of the present disclosure. The liquid cooling enablement module 802 includes a front panel 804, a back panel 806, side panels 808 and 810, a bottom panel 812, and a top panel that has been hidden to reveal the components within the liquid cooling enablement module 802. The liquid cooling enablement module 802 also includes a cold liquid interconnect 830, a hot liquid interconnect 832, a cold liquid manifold 834, a hot liquid manifold 836, a cold liquid line 838, and a hot liquid line 840, which correspond to the cold liquid interconnect 530, a hot liquid interconnect 532, a cold liquid manifold 534, a hot liquid manifold 536, a cold liquid line 538, and a hot liquid line 540 of FIG. 5. The liquid cooling enablement module 802 further includes a pump 850, a liquid reservoir 852, a liquid-to-liquid heat exchanger 854, and water facilities couplers 860 and 862.

When the liquid cooling enablement module 802 is inserted into the rear portion 504 of the chassis 100, each of the cold liquid interconnects 830 connects with a cold liquid interconnect 518 of a different compute device 102 to provide cold liquid to the cooling components 516, 518, 520, 522, and 524 of the compute devices 102, and each of the hot liquid interconnects 832 connects with a hot liquid interconnect 522 of a different compute device 102 to receive heated liquid from the cooling components 516, 518, 520, 522, and 524 of the compute devices 102 as described above with respect to FIG. 5. The water facilities couplers 860 and 862 can extend beyond the back panel 806 and can connect with water facilities outside the chassis 100, such that liquid from the water facilities can be provided to the liquid-to-liquid heat exchanger 854 to remove heat from the liquid returned from the compute devices 102.

The pump 850 can utilize the cold liquid line 838 to pull cooled liquid from the liquid-to-liquid heat exchanger 854, and then push the cooled liquid into the cold liquid manifold 834. The cold liquid manifold 834 can then distribute the cold liquid to each of the cold liquid interconnects 830, which in turn provide the cold liquid to a respective cold liquid interconnect 518 of a compute device 102 to provide liquid cooling to the processors 510 of the computer device 102.

The liquid is then heated via the heat exchange from the processors 510 to the cold plates 516. The heated liquid is then provided to the hot liquid interconnect 832 of the liquid cooling enablement module via the hot liquid interconnect 522 of the compute device 102. The heated liquid from each of the hot liquid interconnects 832 can then be conveyed through the hot liquid manifold 836, which in turn can provide the heated liquid to the liquid reservoir 852. The liquid reservoir 852 can hold the heated liquid until pulled by the pump through the hot liquid line 840 and into the liquid-to-liquid heat exchanger 854. The liquid-to-liquid heat exchanger 854 can then cool the heated water, and the cycle can then be repeated by the cooled liquid being provided to the cold liquid manifold 834 via the pump 850 as described above. In an embodiment, liquid from the water facilities is utilized within the liquid-to-liquid heat exchanger 854 to remove heat from the liquid of the closed loop within the liquid cooling enablement module 802. However, the liquid from the water facilities does not replace or mix with the liquid within the liquid-to-liquid heat exchanger 854. The liquid is conveyed between the liquid-to-liquid heat exchanger 854 and the water facilities via the water facilities couplers 860 and 862. The liquid cooling enablement module 802 is a closed loop system in that the same liquid is used over and over again to cool the processors 510 instead of new liquid being provided from the water facilities.

Thus, the liquid cooling enablement module 802 can provide additional cooling for the processors 510 of the compute devices 102 when air cooling via the fan 124 is not sufficient or efficient to properly cool the processors 510. The liquid cooling enablement module 602 or 802 and liquid cooling components 516, 518, 520, 522, and 524 within the compute devices 102 are self-contained and independent from the chassis 100. Thus, the chassis 100 can be upgraded from an air cooled system to a liquid cooled system with the addition of the liquid cooling components 516, 518, 520, 522, and 524 of the compute devices 102 can be added after the compute devices 102 have already been operating in the chassis 100. In different embodiments, this upgrade of the chassis 100 can be added during manufacture at a factory, or at any point after the chassis has been delivered to a customer or individual, such that the individual has an option to upgrade the chassis 100 in the future. The ability to upgrade the cooling of the chassis 100 with the liquid cooling enablement module 602 or 802 at a future date can result in a lower cost because only the chassis 100 that actually need the additional cooling are upgraded. Thus, the non upgraded chassis 100 can be lower in cost.

When additional cooling is needed, I/O modules 104 can be replaced by the liquid cooling enablement module 602 or 802 to enable the liquid cooling capabilities for the processors 510. In an embodiment, the liquid cooling enablement module 602 or 802 and liquid cooling components 516, 518, 520, 522, and 524 are modular in design so that additional cold plates can be added to cool other components within the compute devices 102 without the chassis 100 or liquid cooling enablement module 602 or 802 having to be changed. Thus, the I/O modules 104 can be replaced by the liquid cooling enablement module 602 or 802 and the liquid cooling components 516, 518, 520, 522, and 524 can be added to the necessary computes devices 102 as needed to provide additional cooling without having to redesign the chassis 100 to accommodate the liquid cooling enablement module 602 or 802 and the liquid cooling components 516, 518, 520, 522, and 524.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A chassis comprising:
a compute device located within a front portion of the chassis, the compute device including:
a processor;
a cold plate in physical communication with the processor;
a cold liquid interconnect coupled to a cold liquid interconnect of a liquid cooling enablement module located in an input/output module bay in a rear portion of the chassis, the cold liquid interconnect to direct liquid into the compute device, wherein the liquid cooling enablement module is a modular self-contained liquid cooling system;
a cold liquid line coupled to the cold plate and to the cold liquid interconnect, the cold liquid line to direct cool liquid from the cold liquid interconnect to the cold plate, wherein the cold plate utilizes the liquid to remove heat from the processor;
a hot liquid interconnect coupled to a hot liquid interconnect of the liquid cooling enablement module, the hot liquid interconnect to direct heated liquid from the compute device; and
a hot liquid line coupled to the cold plate and to the hot liquid interconnect, the hot liquid line to direct the heated liquid from the cold plate to the hot liquid interconnect.

2. The chassis of claim 1 wherein the compute device further comprises:
a plurality of peripheral component interconnect express devices in communication with the processor, the peripheral component interconnect express devices to be cooled via air pulled from a front panel of the chassis across the peripheral component interconnect express devices.

3. The chassis of claim 1 wherein the compute device further comprises:
a communication fabric in communication with the processor, the communication fabric to connect with an input/output module in the rear portion of the chassis.

4. The chassis of claim 1 wherein the compute device further comprises:
a back panel; and
a plurality of opening in the back panel, the openings to enable connections between components of the compute device and input/output modules in the rear portion of the chassis.

5. The chassis of claim 4 wherein the cold liquid interconnect is coupled to the cold liquid interconnect of the liquid cooling enablement module via a first opening of the openings.

6. The chassis of claim 5 wherein the hot liquid interconnect is coupled to the hot liquid interconnect of the liquid cooling enablement module via a second opening of the openings.

7. A chassis comprising:
a liquid cooling enablement module located within an input/output module bay of a back portion of the chassis, the liquid cooling enablement module being a modular self-contained component, the liquid cooling enablement module including:
a first cold liquid interconnect coupled to a second cold liquid interconnect of a first compute device, the first cold liquid interconnect to direct liquid from the liquid cooling enablement module to the second cold liquid interconnect of the first compute device; and
a first hot liquid interconnect coupled to a second hot liquid interconnect of the first compute device, the first hot liquid interconnect to direct the liquid from the second hot liquid interconnect of the first compute device into the liquid cooling enablement module.

8. The chassis of claim 7 wherein the liquid cooling enablement module further comprises:
a third cold liquid interconnect coupled to a fourth cold liquid interconnect of a second compute device, the third cold liquid interconnect to direct the liquid to the second compute device via the fourth cold liquid interconnect; and
a cold liquid manifold coupled to the second and third cold liquid interconnects and to a cold liquid line of the liquid cooling enablement module, the cold liquid manifold to direct the liquid from the cold liquid line to both the second and third cold liquid interconnects.

9. The chassis of claim 7 wherein the liquid cooling enablement module further comprises:
a third hot liquid interconnect coupled to a fourth hot liquid interconnect of a second compute device, the third hot liquid interconnect to direct the heated liquid from the second compute device via the fourth cold liquid interconnect; and
a hot liquid manifold coupled to the second and third hot liquid interconnects and to a hot liquid line of the liquid cooling enablement module, the hot liquid manifold to direct the liquid from both of the second and third hot liquid interconnects to the hot liquid line.

10. The chassis of claim 7 further comprising:
a fan in the back portion, the fan to pull air across components of the first compute device to provide air cooling of the components.

11. The chassis of claim 10 further comprising:
a bulkhead in physical communication with both the front and back portions, the bulkhead to direct flow from the first compute device to the fan.

12. The chassis of claim 11 wherein the bulkhead further comprises:
a plurality of openings, the openings to enable connections between components of the first compute device and first and second input/output modules in the back portion of the chassis, wherein the first cold liquid interconnect is coupled to the second cold liquid interconnect of the first compute device through a first opening of the openings.

13. The chassis of claim 12 wherein the first hot liquid interconnect is coupled to the second hot liquid interconnect of the first compute device through a second opening of the openings.

14. A chassis comprising:
a compute device located within a front portion of the chassis, the compute device includes:
a processor;
a cold plate in physical communication with the processor;
a first cold liquid line coupled to the cold plate, the first cold liquid line to direct cool liquid from a first cold liquid interconnect of the compute device to the cold plate, wherein the cold plate utilizes the liquid to remove heat from the processor; and a first hot liquid line coupled to the cold plate, the first hot liquid line to direct heated liquid from the cold plate to a first hot liquid interconnect of the compute device; and a liquid cooling enablement module located within an input/output device bay a back portion of the chassis, wherein the liquid cooling enablement module is a modular self-contained component, the liquid cooling enablement module includes:

a second cold liquid interconnect coupled to the first cold liquid interconnect, the second cold liquid interconnect to direct the liquid from the liquid cooling enablement module to the first cold liquid line via the first cold liquid interconnect; and a second hot liquid interconnect coupled to the first hot liquid interconnect, the second hot liquid interconnect to direct the liquid from the first hot liquid line to the liquid cooling enablement module via the first hot liquid interconnect.

15. The chassis of claim 14 wherein the liquid cooling enablement module further comprises:

a third cold liquid interconnect coupled to a fourth cold liquid interconnect of a second compute device, the third cold liquid interconnect to direct the liquid to the second compute device via the fourth cold liquid interconnect; and a cold liquid manifold coupled to the second and third cold liquid interconnects and to a second cold liquid line of the liquid cooling enablement module, the cold liquid manifold to direct the liquid from the second cold liquid line to both the second and third cold liquid interconnects.

16. The chassis of claim 14 wherein the liquid cooling enablement module further comprises:

a third hot liquid interconnect coupled to a fourth hot liquid interconnect of a second compute device, the third hot liquid interconnect to direct the heated liquid from the second compute device via the fourth hot liquid interconnect; and a hot liquid manifold coupled to the second and third hot liquid interconnects and to a second hot liquid line of the liquid cooling enablement module, the hot liquid manifold to direct the liquid from both of the second and third hot liquid interconnects to the second hot liquid line.

17. The chassis of claim 14 further comprising:

a fan in the back portion, the fan to pull air across components of the compute device to provide air cooling of the components.

18. The chassis of claim 17 further comprising:

a bulkhead in physical communication with both the front and back portions, the bulkhead to direct flow from the compute device to the fan.

* * * * *